(12) United States Patent
Jurisch et al.

(10) Patent No.: US 6,820,017 B1
(45) Date of Patent: Nov. 16, 2004

(54) METHOD FOR DETERMINING THE AMPLITUDE AND PHASE ANGLE OF A MEASURING SIGNAL CORRESPONDING TO A CURRENT OR VOLTAGE OF AN ELECTRICAL POWER SUPPLY NETWORK

(75) Inventors: Andreas Jurisch, Schwante (DE); Dieter Kramer, Dresden (DE)

(73) Assignee: Siemens Aktiengesellschaft, Munich (DE)

(*) Notice: Subject to any disclaimer, the term of this patent is extended or adjusted under 35 U.S.C. 154(b) by 71 days.

(21) Appl. No.: 10/031,733

(22) PCT Filed: Jul. 19, 2000

(86) PCT No.: PCT/DE00/02434

§ 371 (c)(1),
(2), (4) Date: Jan. 22, 2002

(87) PCT Pub. No.: WO01/06265

PCT Pub. Date: Jan. 25, 2001

(30) Foreign Application Priority Data

Jul. 19, 1999 (DE) .......................................... 199 34 055

(51) Int. Cl.⁷ .............................................. H03C 5/00
(52) U.S. Cl. .............................. 702/60; 702/57; 702/58; 702/59; 702/62; 702/64; 702/68; 702/76
(58) Field of Search .............................. 702/57–60, 62, 702/64–67, 69–76, 79.126, FOR 103, FOR 111; 324/76.11, 76.12, 76.13, 76.15, 76.18, 76.39, 76.47, 76.52, 76.54, 76.55, 76.72; 361/76, 78, 79, 85, 87; 375/326, 328, 329, 330

(56) References Cited

U.S. PATENT DOCUMENTS

| | | | |
|---|---|---|---|
| 4,340,854 A | * | 7/1982 | Jones et al. .................. 324/623 |
| 4,625,283 A | * | 11/1986 | Hurley ......................... 702/75 |
| 4,645,881 A | * | 2/1987 | LeToumelin et al. ........ 379/252 |
| 4,723,216 A | * | 2/1988 | Premerlani .................. 702/126 |

(List continued on next page.)

FOREIGN PATENT DOCUMENTS

| DE | 42 05 300 | 7/1973 |
|---|---|---|
| DE | 42 11 946 | 9/1993 |

OTHER PUBLICATIONS

XP–000978300 A Recursive Least Error Squares Algorithm for Power System Relaying and Measurement Applications, Sachdev et al., pp. 1008–1015.
Lexikon Mef–und Automatisierungstechnik.
Digitale Schutztechnik, Hermann.
Echtzeitprozebmodelle auf der Basis von Parameterschatzverfahren, Wede et al.
Digitale Impedanzmessverfahren Auf Der Basis Von Identifikationschemethoden.

*Primary Examiner*—Marc S. Hoff
*Assistant Examiner*—Carol S. W. Tsai
(74) *Attorney, Agent, or Firm*—Bell Boyd & Lloyd LLC

(57) ABSTRACT

A method for determining the amplitude and phase angle of a measuring signal corresponding to a current or a voltage on an electrical power supply network by using sampled values of the measuring signal, a model of the measuring signal containing at least a sinusoidal component being used to calculate the amplitude and phase of the measuring signal with the sampled values by applying a recursive least-squares estimation method.

In order to be able to determine the frequency of the measuring signal together with the amplitude and the phase angle, use is made of a model of the measuring signal in accordance with the relationship $y = A \cdot \sin(2\pi f t + \phi)$, and by using this model and the sampled values ($y_m$), the determination of the frequency of the measuring signal ($u_m$) as well is carried out via a recursive nonlinear least-squares estimation method. By expanding the signal model, measuring signals with a DC component and with frequencies that change over time also can be investigated.

4 Claims, 3 Drawing Sheets

U.S. PATENT DOCUMENTS

| | | | | |
|---|---|---|---|---|
| 5,162,723 A | * | 11/1992 | Marzalek et al. | 324/76.19 |
| 5,165,051 A | * | 11/1992 | Kumar | 324/76.47 |
| 5,268,930 A | * | 12/1993 | Sendyk et al. | 375/231 |
| 5,343,404 A | * | 8/1994 | Girgis | 702/72 |
| 5,363,103 A | * | 11/1994 | Inkol | 342/13 |
| 5,404,388 A | * | 4/1995 | Eu | 379/24 |
| 5,424,680 A | * | 6/1995 | Nazarathy et al. | 330/149 |
| 5,493,228 A | * | 2/1996 | Eriksson et al. | 324/522 |
| 5,729,465 A | | 3/1998 | Barbaresco | |
| 5,748,677 A | * | 5/1998 | Kumar | 375/285 |
| 5,867,538 A | * | 2/1999 | Liu | 375/341 |
| 5,875,215 A | * | 2/1999 | Dobrica | 375/344 |
| 6,115,426 A | * | 9/2000 | Fujimoto et al. | 375/260 |
| 6,242,698 B1 | * | 6/2001 | Baker et al. | 174/72 A |
| 6,505,053 B1 | * | 1/2003 | Winters et al. | 455/504 |
| 2002/0171411 A1 | * | 11/2002 | Nasman | 324/76.52 |

* cited by examiner

METHOD FOR DETERMINING THE AMPLITUDE AND PHASE ANGLE OF A MEASURING SIGNAL CORRESPONDING TO A CURRENT OR VOLTAGE OF AN ELECTRICAL POWER SUPPLY NETWORK

BACKGROUND OF THE INVENTION

The present invention relates to a method for determining the amplitude and phase angle of a measuring signal corresponding to a current or a voltage on an electrical power supply network by using sampled values of the measuring signal, a model of the measuring signal containing at least a sinusoidal component being used to calculate the model amplitude and phase parameters of the measuring signal with the sampled values by applying a recursive least-squares estimation method.

A method of this type is described in an article by M. S. Sachdev and M. Nagpal "A recursive least squares error algorithm for power system relaying and measurement applications", IEEE Trans. on Power Delivery, Vol. 6, No. 3, July 1991. In the case of this known method, sampled values are formed from a measuring signal corresponding to a current or voltage of an electrical power supply network and, via a linear least-squares estimation method, by using a sinusoidal signal model that models the measuring signal, are used to form a complex vector which specifies the amplitude and phase angle of the measuring signal. In this case, in a first step the real and imaginary part of the vector are in each case determined on their own. Then, in a second step, via a coordinate transformation, the polar coordinate representation of the complex vector, that is to say the magnitude and phase of the vector, can be determined from the real and imaginary part of the vector.

In the case of the known method, it is assumed that the frequency of the measuring signal is known. If this is not so, or if the frequency changes, then a separate method is needed in order to determine the frequency of the measuring signal. Methods are known, for example, which measure the distance of the zero transitions of the measuring signal and, on the basis of measuring this period, determine the frequency of the measuring signal; see, for example, E. Schrüfer (Editor): "Lexikon Meβ- und Automatisierungstechnik" [Measurement and Automation Encyclopedia], VDI-Verlag, 1992, p. 204. Also known is a method for frequency measurement in which the measured signal to be examined is, in each case, filtered in parallel by a high-pass filter and an all-pass filter (German patent DE 42 11 946). The frequency of the measuring signal can be determined via the ratio between the amplitudes of the output signals from these two filters.

The present invention is directed toward specifying a method with which all the significant variables of the measuring signal can be determined simultaneously and quickly.

SUMMARY OF THE INVENTION

In the case of a method of the type indicated at the beginning, this object is achieved, according to the present invention, in that use is made of a model of the measuring signal containing the sinusoidal component in accordance with the relationship y=A·sin(2πft+φ), y designating an instantaneous value of the model of the measuring signal, A the amplitude, f the frequency, φ the phase angle and t the time. By using this model of the measuring signal and by using the sampled values, via a recursive nonlinear least-squares estimation method, the model frequency parameter of the measuring signal is also determined by the estimation together with the model amplitude parameter and the model phase angle parameter.

Although it is known, from the book by H. J. Hermann, "Digitale Schutztechnik" [Digital Protection Engineering], 1997, p.p. 110–111, to use a recursive, nonlinear least-squares estimation method in protection engineering, the book does not contain any reference to the fact that by using such an estimation method, sampled values of a measuring signal can be used to determine the amplitude, phase angle and frequency of the measuring signal in a single measured-value processing process.

A significant advantage of the method according to the present invention is, however, precisely that the sampled values of the measuring signal are used to determine the frequency, as well as the amplitude and phase angle, in a measured-value processing process. Therefore, the amplitude, phase angle and frequency of the measuring signal are associated with the same point in time.

Furthermore, the patent DE 42 05 300 C1 discloses a method with which the phase angle and the amplitude of a periodic signal can be determined via a phase-locked control loop (PLL (Phase-Locked Loop)).

The use of the model for the measuring signal y=A·sin (2πft+φ) leads to good results if the measuring signal has a purely sinusoidal waveform. If there is a DC component present in the measuring signal, a model of the measuring signal in accordance with the relationship y=A·sin(2πft+φ)+d is advantageously used, the summand d modeling the DC component of the measuring signal.

If the measuring signal is a signal whose frequency changes over time, in the case of such measuring signals without a DC component, a model of the measuring signal in accordance with the relationship $$y = A \cdot \sin\left(2\pi \sum_{i=0}^{n} (f^{(i)} t^i) t + \varphi\right)$$

advantageously can be used, and in the case of measuring signals with a DC component, a model of the measuring signal in accordance with the relationship $$y = A \cdot \sin\left(2\pi \sum_{i=0}^{n} (f^{(i)} t^i) t + \varphi\right) + d$$

advantageously can be used, $f^{(i)}$ designating the ith time derivative of the frequency and modeling a change in the frequency over time, and various orders of the time derivative of the frequency being taken into account by selecting the variable n. In these models, in an extension of the model specified above, y=A·sin(2πft+φ), the frequency f is replaced by the expression $$\sum_{i=0}^{n} (f^{(i)} t^i);$$

if only a 0th order derivative is taken into account, the integral expression becomes $f^{(0)}$ or f. These expanded models make it possible to determine frequency changes $f^{(i)}$ over time, in addition to the variables amplitude A, phase angle φ and frequency f.

In a further advantageous embodiment of the method according to the present invention, the values of the amplitude A, the phase angle φ and the frequency f determined by the estimation method are output as results only when the estimation error is less than a smallest permitted estimation error. This has the advantage that, in particular, the values estimated at the start of the method and afflicted by large estimation errors are not output, and therefore the large estimation errors cannot have any negative consequences for a user of the method.

Additional features and advantages of the present invention are described in, and will be apparent from, the following Detailed Description of the Invention and the Figures.

DETAILED DESCRIPTION OF THE INVENTION

Figure 1:
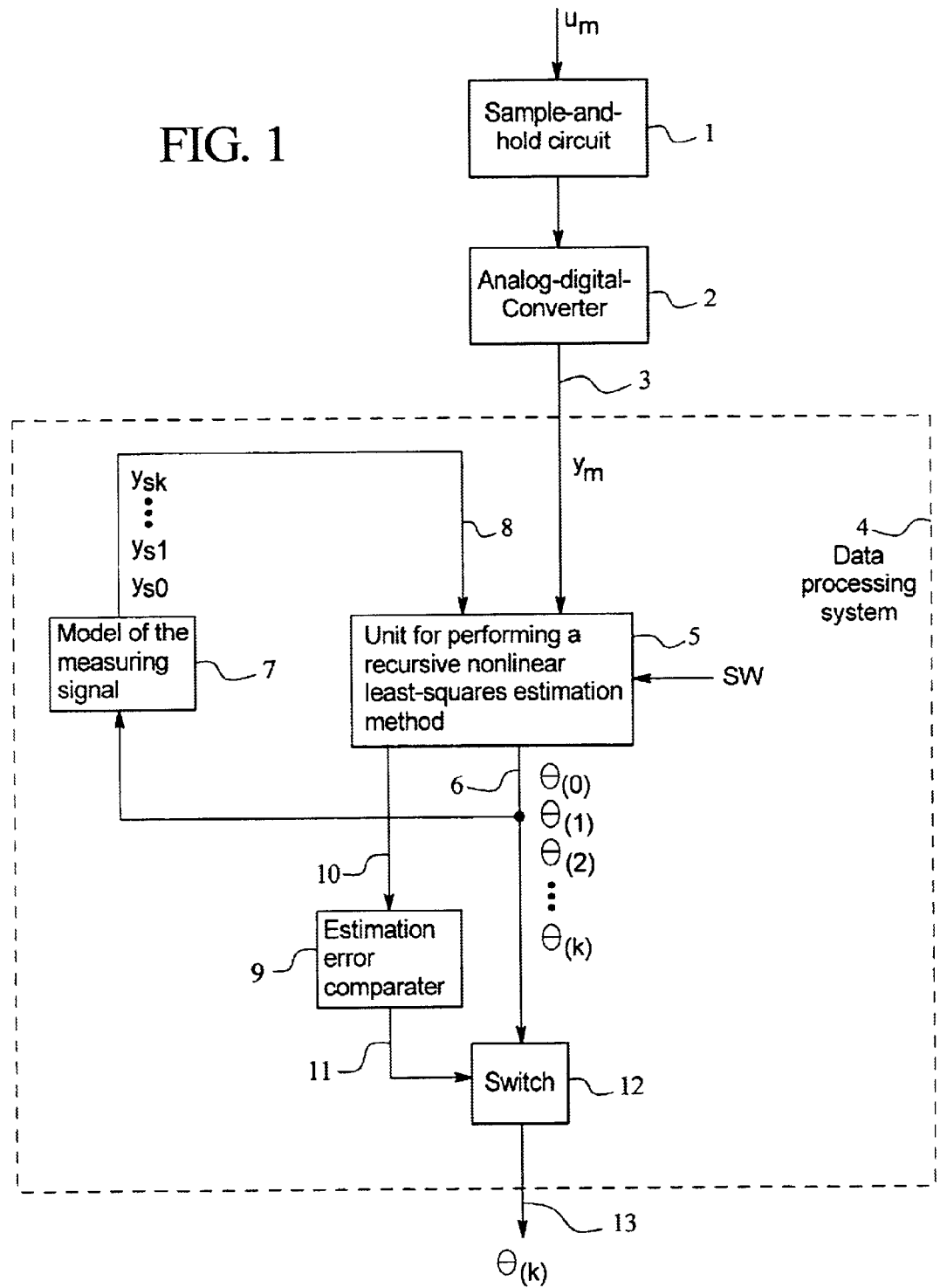
FIG. 1 shows, by using a block diagram, the progress of an exemplary embodiment of the method according to the present invention.

According to FIG. 1, after being sampled in a sample-and-hold circuit 1 and after analog-digital conversion in an analog-digital converter 2, sampled values $y_m$ of a measuring signal $u_m$ are present on an input 3 of a data processing system 4. The data processing system 4 contains a unit 5 for carrying out a recursive nonlinear least-squares estimation method.

At the beginning of the recursive estimation method, starting values SW for the variables amplitude A, frequency f and phase angle φ are input into the unit 5 and are present on the output 6 of the unit 5 as estimation output values $\Theta_{(0)}$. The estimation output values $\Theta_{(0)}$ are led to a block 7, which contains a model of the measuring signal.

In the block 7, the estimation output values $\Theta_{(0)}$ are used, taking into account the model of the measuring signal, to determine a starting signal value $y_{s0}$, which is output at the output of the block 7 and led to an input 8 of the unit 5.

The unit 5 uses a (first) sampled value $y_m$ of the measuring signal $u_m$ and the starting signal value $y_{s0}$ to determine an estimation error $F_{estim}$ in accordance with the relationship (3) recited below. This estimation error will lie above a permitted smallest estimation error. Therefore, in the unit 5 and starting from the estimation output values $\Theta_{(0)}$, in accordance with the rules for recursive nonlinear least-square estimations, new estimated values $\Theta_{(1)}$ are formed in accordance with the relationship (1) below, are output at the output 6 of the unit 5 and led to block 7.

In block 7, the new estimated values $\Theta_{(1)}$ are used to determine an estimated signal value $y_{s1}$, which is output at the output of block 7 and is led to the input 8 of the unit 5. The unit 5 uses the (first two) sampled values $y_m$ and the starting signal value $y_{s0}$ and the estimated signal value $y_{s1}$ again to form an estimation error $F_{estim}$ in accordance with the relationship (3) recited below. This estimation error will generally also lie above the smallest permitted estimation error. Therefore, in the unit 5 and starting from the estimated values $\Theta_{(1)}$ on the preceding estimation, new estimated values $\Theta_{(2)}$ are again determined in accordance with the relationship (1). These steps are repeated until the estimation error $F_{estim}$ lies below a smallest permitted estimation error.

In order to determine whether the estimation error $F_{estim}$ lies below a smallest permitted estimation error, use is made of a block 9. Via an input 10, block 9 obtains from the unit 5 the sampled values $y_m$ of the measuring signal $u_m$, the starting signal value $y_{s0}$ and the estimated signal values $y_{s1}$ to $y_{sk}$, which are buffered in the unit 5. When the estimation error $F_{estim}$ lies below a smallest permitted estimation error, then a switching signal, which switches a switch 12 on, is output at an output 11 of the block 9. The switch 12 then forwards the estimated values $\Theta_{(k)}$ present at the output 6 of the unit 5 to an output 13 of the data processing system 4. The estimated values $\Theta_{(k)}$ are then output as the resulting values from the estimation method and constitute the values for amplitude, frequency and phase angle of the measuring signal, estimated with sufficient accuracy. After that, the estimation method continues to run as described above and permits continuous determination of the estimated values $\Theta_{(k)}$.

The unit 5 determines the estimated values $\Theta_{(k)}$ in accordance with the following relationship (1).

$$\Theta_{(k)} = \Theta_{(k-1)} + P_{(k)} \gamma_{(k)} (y_{(k)} - h(\phi_{(k)}, \Theta_{(k-1)})) \qquad (1)$$

In relationship (1), $\Theta_{(k)}$ represents a vector which contains the estimated values of the variables to be determined, that is to say, here, the amplitude A, frequency f and phase angle φ, after k estimation steps; $\Theta_{(k-1)}$ designates a vector which results in the case of the estimation after k−1 estimation steps. The matrix $P_{(k)}$ is a symmetrical precision matrix, as it is known, whose determination is presented further below using the relationship (2). The function $h(\phi_{(k)}, \Theta_{(k-1)})$ contains the model of the measuring signal. The vector $\gamma_{(k)}$ contains the partial derivatives of the model $h(\phi_{(k)}, \Theta_{(k-1)})$ of the measuring signal with respect to the parameters of the model of the measuring signal; that is to say, the derivatives with respect to amplitude, phase angle and frequency. The variable $y_{(k)}$ is the kth sampled value of the measuring signal.

In order to determine the precision matrix $P_{(k)}$, use is made of a relationship (2).

$$P_{(k)} = \frac{1}{\lambda} \left( P_{(k-1)} - \frac{P_{(k-1)} \cdot \gamma_{(k)}}{\lambda + \gamma_{(k)}^T P_{(k-1)} \gamma_{(k)}} \cdot \gamma_{(k)}^T P_{(k-1)} \right) \qquad (2)$$

The factor λ determines the exponential weighting of preceding sampled values of the measuring signal. At the beginning of the method, a starting value is used for the precision matrix $P_{(k)}$.

The estimation error $F_{estim}$ after the kth estimation is determined via the relationship $$F_{schatz} = \frac{1}{N} \sum_{i=k-N+1}^{k} (y_{mi} - y_{Rj})^2 \qquad (3)$$

Here, N is the number to be taken into account of the sampled values $y_m$ of the measuring signal $u_m$ and of the estimated signal values $y_s$, $y_{mi}$ is the ith sampled value of the measuring signal $u_m$ and $y_{si}$ is the ith estimated signal value.

The estimation error $F_{estim}$ is determined by N sampled values $y_{mi}$ of the measuring signal $u_m$ and N estimated signal values $y_{si}$ being evaluated. An appropriate magnitude for N is the quotient of the (sampling frequency of the sample-and-hold circuit 1)/(estimated frequency), but N also can be selected to be larger. During the first estimation pass, the value used for N is the quotient of (sampling frequency of the sample-and-hold circuit 1)/(starting value SW of the frequency). When, at the beginning of the estimation method, N sampled values $y_{mi}$ of the measuring signal $u_m$, or N estimated signal values $y_{si}$ are not yet present, then only the present values are used to determine the estimation error $F_{estim}$.

Further details relating to carrying out recursive nonlinear least-squares estimation methods are described in the documents J. Wede; D. Werner: "Echtzeitprozeßmodelle auf der Basis von Parameterschätzverfahren" [Real-time process models based on parameter estimation methods], automation engineering series, Vol. 214, VEB Verlag Technik, Berlin, 1985, p.p. 30–34, p.p. 44–50, 56, 57, and Hans-Joachim Herrmann: "Digitale Schutztechnik: Grundlagen, Software, Ausführungsbeispiele" [Digital Protection Engineering: Principles, Software, Design Examples], VDE Verlag 1997, p.p. 104–113, and A. Jurisch: "Digitale Impedanzmeßverfahren auf der Basis von Identifikationsmethoden" [Digital Impedance Measuring Methods Based on Identification Methods], Dissertation, Technische Hochschule Zittau, 1990, Annex 4.6.3.

Figure 2:
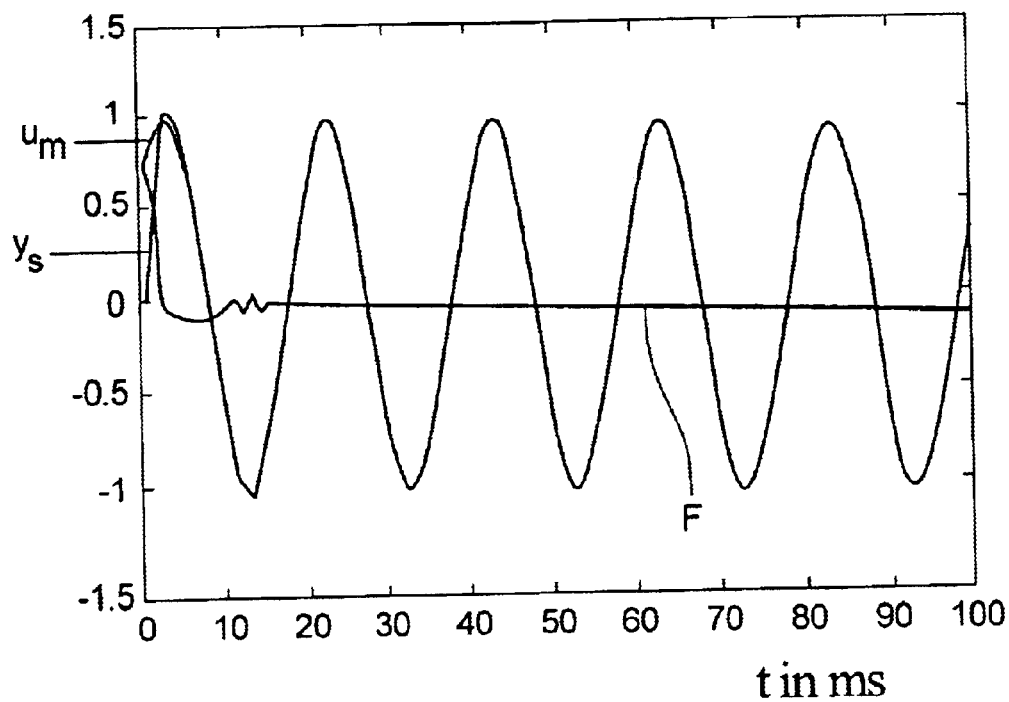
FIG. 2 shows waveforms of a measuring signal, of an estimated signal $y_S$ determined for the measuring signal by using a model $y = A \cdot \sin(2\pi f t + \phi)$ and of the resulting error F.

FIG. 2 shows the time-based waveform of a sinusoidal measuring signal $u_m$, whose amplitude, frequency and phase angle are to be determined by using the estimation method according to FIG. 1. Also shown over time, as the curve $y_s$, are the estimated signal values $y_{s1} \ldots y_{sk}$ which are output at the output of block 7. Also shown is the waveform of the values of the error F which results from the difference between the measuring signal $u_m$ and the estimated signal values $y_{s1} \ldots y_{sk}$, over time t. The waveforms shown result from an estimation method which is carried out by using the model $y = A \cdot \sin(2\pi ft + \phi)$ for the measuring signal. It can be seen that the waveform of the curve $y_s$ is the same as the waveform of the measuring signal $u_m$ after about 20 ms; the error F then assumes very small values. The estimation method, therefore, permits the correct determination of the amplitude, the frequency and the phase angle of the measuring angle after about one period of the measuring signal $u_m$.

Figure 3:
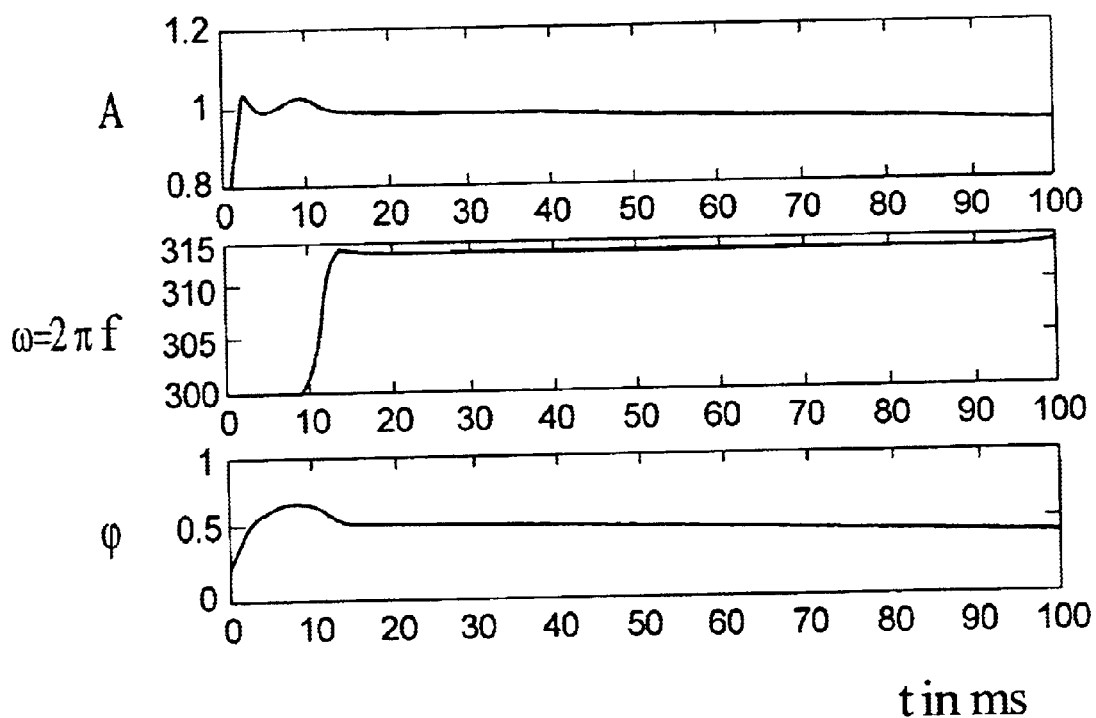
FIG. 3 shows results of the method according to the present invention in the case of a purely sinusoidal measuring signal when use is made of an appropriate model of the measuring signal, separated in accordance with the time-based waveforms of amplitude, phase angle and frequency.

In FIG. 3, taking into account the waveforms shown in FIG. 2, the estimated values $\Theta_{(1)} \ldots \Theta_{(k)}$ linked with the estimated signal values $y_{s1} \ldots y_{sk}$ are plotted against the time t, separated in accordance with the variables A, ω and $2\pi f$ and $\phi$ that determine them. In an upper graph, FIG. 3 shows the waveform of the amplitude A determined by the estimation method according to FIG. 1, in a central graph the waveform of the variable $\omega = 2\pi f$ that is proportional to the frequency f, and in a lower graph the waveform of the phase angle $\phi$, in each case plotted against time. According to FIG. 2, the result that the time-based waveforms have reached a steady state at their final value after about 20 ms with the smallest permitted estimation error, and indicate the result of the estimation method.

Figure 4:
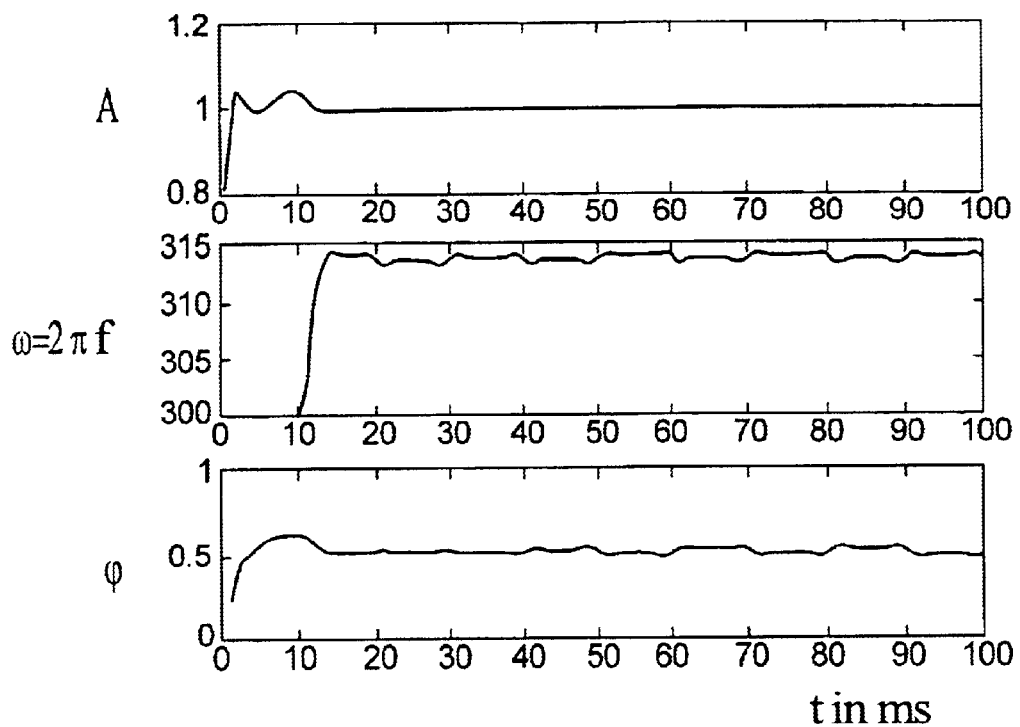
FIG. 4 shows results of the method according to the present invention in the case of a measuring signal subject to an offset, that is to say containing a DC component, separated in accordance with the time-based waveforms of amplitude, phase angle and frequency, when use is made of a model of the measuring signal that does not model any DC component.

FIG. 4 shows, in a manner of representation which is the same as FIG. 3, the time-based waveforms of amplitude A, frequency f and phase angle $\phi$ determined in a further estimation by using the model of the measuring signal $y = A \cdot \sin(2\pi ft + \phi)$ if use is made of sampled values of a measuring signal which contains a DC component. The waveforms of frequency and phase angle also contain large time-based fluctuations for times greater than 20 ms. These fluctuations point to an erroneous estimation and are a reference to the fact that the selected model is not beneficial for a measuring signal containing a DC component.

Figure 5:
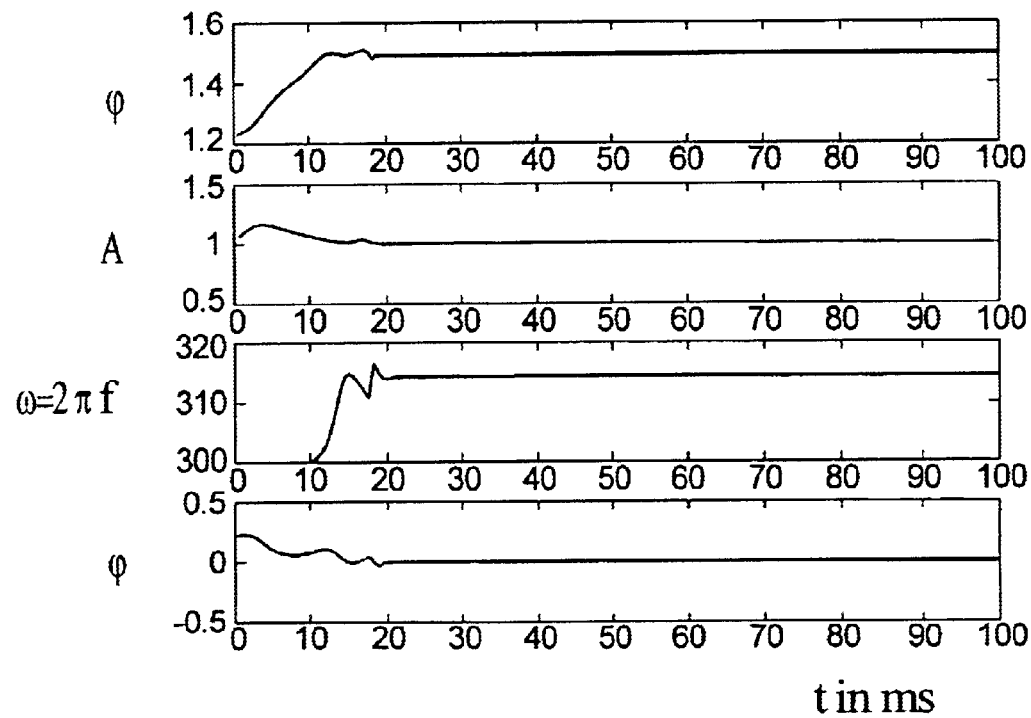
FIG. 5 shows results of the method according to the present invention in the case of a measuring signal subject to an offset, that is to say containing a DC component, separated in accordance with the time-based waveforms of amplitude, phase angle, frequency and DC component, when use is made of a model of the measuring signal that models a DC component.

FIG. 5 shows the time-based waveforms of amplitude A, frequency f, phase angle $\phi$ and DC component d determined in an estimation using the model $y = A \cdot \sin(2\pi ft + \phi) + d$ for the measuring signal, if use is made of sampled values of a measuring signal which contains a DC component. By using the model just mentioned of the measuring signal, fluctuations in the time-based waveforms of frequency and phase angle are avoided; consequently, an estimation which is better with regard to the estimation error is carried out.

Although the present invention has been described with reference to specific embodiment, those of skill in the art will recognize that changes may be made thereto without departing from the spirit and scope of the invention as set forth in the hereafter appended claims.

What is claimed is:

1. A method for determining an amplitude and phase angle of a measuring signal corresponding to a current or a voltage on an electrical power supply network by using sampled values of the measuring signal, the method comprising the steps of:

using a model of the measuring signal containing a sinusoidal component in accordance with a relationship $$y = A \cdot \sin\left(2\pi \sum_{i=0}^{n} (f^{(i)} t^i) t + \varphi \right)$$

with $f^{(i)}$ designating an ith order time derivative of the frequency and modeling a change in the frequency over time, and various orders of the time derivative of the frequency being taken into account by selecting an variable n,, with y designating an instantaneous value of the model of the measuring signal, A designating a model amplitude parameter of the measuring signal, f designating a model frequency parameter of the measuring signal, $\phi$ designating a model phase angle parameter of the measuring signal and t designating time; and using both the model of the measuring signal and the sampled values, via a recursive nonlinear least-squares estimation method, to determine the model frequency parameter of the measuring signal by the estimation together with the model amplitude parameter and the model phase angle parameter.

2. A method for determining an amplitude and phase angle of a measuring signal as claimed in claim 1, wherein use is made of a model of the measuring signal in accordance with a relationship $y = A \cdot \sin(2\pi ft + \phi) + d$, with d modeling a DC component of the measuring signal.

3. A method for determining an amplitude and phase angle of a measuring signal as claimed in claim 2, wherein use is made of a model of the measuring signal in accordance with a relationship $$y = A \cdot \sin\left(2\pi \sum_{i=0}^{n} (f^{(i)} t^i) t + \varphi\right) + d,$$

with $f^{(i)}$ designating an ith time derivative of the frequency and modeling a change in the frequency over time, and various orders of the time derivative of the frequency being taken into account by selecting a variable n.

4. A method for determining an amplitude and phase angle of a measuring signal as claimed in claim 1, wherein the determined model amplitude parameter, the determined model phase angle parameter and the determined model frequency parameter determined by the estimation method are output as resulting values only when an estimation error is less than a smallest permitted estimation error.

* * * * *